US007016167B2

(12) United States Patent
Fontana, Jr. et al.

(10) Patent No.: US 7,016,167 B2
(45) Date of Patent: Mar. 21, 2006

(54) SPIN VALVE TRANSISTOR WITH STABILIZATION AND METHOD FOR PRODUCING THE SAME

(75) Inventors: Robert E. Fontana, Jr., San Jose, CA (US); Jeffrey S. Lille, Sunnyvale, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 19 days.

(21) Appl. No.: 10/406,779

(22) Filed: Apr. 3, 2003

(65) Prior Publication Data

US 2004/0105195 A1 Jun. 3, 2004

Related U.S. Application Data

(63) Continuation-in-part of application No. 10/307,062, filed on Nov. 29, 2002.

(51) Int. Cl.
*G11B 5/127* (2006.01)

(52) U.S. Cl. ...................... 360/324.12; 428/692; 438/3

(58) Field of Classification Search ................ 360/313, 360/324.1, 324.11, 324.12, 324.2; 428/692; 438/3; 257/295, 421, 422, 423

See application file for complete search history.

(56) References Cited

U.S. PATENT DOCUMENTS

| | | | | | |
|---|---|---|---|---|---|
| 5,729,410 | A | * | 3/1998 | Fontana et al. | 360/324.2 |
| 5,962,905 | A | * | 10/1999 | Kamiguchi et al. | 257/421 |
| 5,973,334 | A | * | 10/1999 | Mizushima et al. | 257/25 |
| 6,266,218 | B1 | * | 7/2001 | Carey et al. | 360/324.12 |
| 6,480,365 | B1 | * | 11/2002 | Gill et al. | 360/324.11 |
| 2003/0214763 | A1 | * | 11/2003 | Childress et al. | 360/324.2 |

FOREIGN PATENT DOCUMENTS

JP 2002-26422 * 1/2004

* cited by examiner

*Primary Examiner*—Angel Castro

(74) *Attorney, Agent, or Firm*—McGinn & Gibb, PLLC; Lewis L. Nunnelley; Matthew S. Zises

(57) ABSTRACT

A method and structure for a spin valve transistor (SVT) comprises a magnetic field sensor, an insulating layer adjacent the magnetic field sensor, a bias layer adjacent the insulating layer, a non-magnetic layer adjacent the bias layer, and a ferromagnetic layer over the non-magnetic layer, wherein the insulating layer and the non-magnetic layer comprise antiferromagnetic materials. The magnetic field sensor comprises a base region, a collector region adjacent the base region, an emitter region adjacent the base region, and a barrier region located between the base region and the emitter region. The bias layer is between the insulating layer and the non-magnetic layer. The bias layer is magnetic and is at least three times the thickness of the magnetic materials in the base region.

1 Claim, 12 Drawing Sheets

SPIN VALVE TRANSISTOR WITH STABILIZATION AND METHOD FOR PRODUCING THE SAME

CROSS-REFERENCE TO RELATED APPLICATION

This application is a continuation-in-part of U.S. patent application Ser. No. 10/307,062, filed Nov. 29, 2002, entitled "Spin Valve Transistor With Stabilization and Method for Producing the Same", the complete disclosure of which is herein incorporated by reference.

BACKGROUND OF THE INVENTION

1. Field of the Invention

The present invention generally relates to magnetoelectronic devices, and more particularly to a spin valve transistor (SVT) having an insulating hard bias stabilization.

2. Description of the Related Art

A spin valve transistor is a vertical spin injection device which has spin oriented electrons injected over a barrier into a free layer, and is used as a magnetic field sensor device. Those spin oriented electrons that are not spin scattered continue and then traverse a second barrier. The current over the second barrier is referred to as the magneto-current. Conventional devices are constructed using silicon wafer bonding to define the barriers.

Conventional spin valve transistors are constructed using a traditional three-terminal framework having an emitter/base/collector structure of a bipolar transistor. SVTs further include a spin valve on a metallic base region, whereby the collector current is controlled by the magnetic state of the base using spin-dependent scattering.

Magnetoresistive (MR) sensors have also been proposed to be incorporated as the read sensor in hard disk drives as described in U.S. Pat. Nos. 5,390,061 and 5,729,410, the complete disclosures of which are herein incorporated by reference. A magnetoresistive sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy ($Ni_{81}Fe_{19}$). A component of the read element resistance varies as the square of the cosine of the angle between the magnetization direction in the read element and the direction of sense current through the read element. Recorded data can be read from a magnetic medium, such as the disk in a disk drive, because the external magnetic field from the recorded magnetic medium (the signal field) causes a change in the direction of magnetization in the read element, which in turn causes a change in resistance of the read element and a corresponding change in the sensed current or voltage.

The use of an SVT device such as a MR read head has also been proposed, as described in U.S. Pat. No. 5,390,061. One of the problems with such a MR read head, however, lies in developing a structure that generates an output signal that is both stable and linear with the magnetic field strength from the recorded medium. If some means is not used to maintain the ferromagnetic sensing layer of the SVT device (i.e., the ferromagnetic layer whose moment is not fixed) in a single magnetic domain state, the domain walls of magnetic domains will shift positions within the ferromagnetic sensing layer, causing noise which reduces the signal-to-noise ratio and which may give rise to an irreproducible response of the head. A linear response of the head is required. The problem of maintaining a single magnetic domain state is especially difficult in the case of an SVT MR read head because, unlike an AMR sensor, the sense current passes perpendicularly through the ferromagnetic layers and the tunnel barrier layer, and thus any metallic materials in direct contact with the edges of the ferromagnetic layers will short circuit the electrical resistance of the read head.

FIG. 1(*a*) is a simplified block diagram of a conventional magnetic recording disk drive for use with the SVT MR read head, and FIG. 1(*b*) is a top view of the disk drive of FIG. 1(*a*) with the cover removed. Referring first to FIG. 1(*a*), there is illustrated in a sectional view a schematic of a conventional disk drive of the type using a MR sensor. The disk drive comprises a base 510 to which are secured a disk drive motor 512 and an actuator 514, and a cover 511. The base 510 and cover 511 provide a substantially sealed housing for the disk drive. Typically, there is a gasket 513 located between base 510 and cover 511 and a small breather port (not shown) for equalizing pressure between the interior of the disk drive and the outside environment. A magnetic recording disk 516 is connected to drive motor 512 by means of hub 518 to which it is attached for rotation by the drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a MR read head portion. The slider 520 is connected to the actuator 514 by means of a rigid arm 522 and a suspension 524. The suspension 524 provides a biasing force which urges the slider 520 onto the surface of the recording disk 516. During operation of the disk drive, the drive motor 512 rotates the disk 516 at a constant speed, and the actuator 514, which is typically a linear or rotary voice coil motor (VCM), moves the slider 520 generally radially across the surface of the disk 516 so that the read/write head 525 may access different data tracks on disk 516.

FIG. 1(*b*) is a top view of the interior of the disk drive with the cover 511 removed, and illustrates in better detail the suspension 524 which provides a force to the slider 520 to urge it toward the disk 516. The suspension may be a conventional type of suspension, such as the well-known Watrous suspension, as described in U.S. Pat. No. 4,167,765, the complete disclosure of which is herein incorporated by reference. This type of suspension also provides a gimbaled attachment of the slider which allows the slider to pitch and roll as it rides on the air bearing surface. The data detected from disk 516 by the transducer 525 is processed into a data readback signal by signal amplification and processing circuitry in the integrated circuit chip 515 located on arm 522. The signals from transducer 525 travel via flex cable 517 to chip 515, which sends its output signals to the disk drive electronics (not shown) via cable 519.

A conventional SVT is described by Jansen, R. et al., *Journal of Applied Physics*, Vol. 89, No. 11, June 2001, "The spin-valve transistor: Fabrication, characterization, and physics," the complete disclosure of which is herein incorporated by reference. FIG. 1(*c*) illustrates a conventional SVT having a semiconductor emitter region, a collector region, and a base region which contains a metallic spin valve. The semiconductors and magnetic materials used may include an n-type Si as an emitter and collector, and a $Ni_{80}Fe_{20}$/Au/Co spin valve in the base region. Energy barriers, also referred to as Schottky barriers are formed at the junctions between the metal base and the semiconductors. It is desirable to obtain a high quality energy barrier at these junctions having good rectifying behavior, therefore, thin layers of magnetic materials, such as Pt and Au, are used at the emitter and collector regions, respectively. Moreover, these thin layers separate the magnetic layers from the semiconductor materials.

A conventional SVT functions when current is introduced between the emitter region and the base region (denoted as $I_E$ in FIG. 1(*c*)). This occurs when electrons are injected over the energy barrier and into the base region, such that the electrons are perpendicular to the layers of the spin valve. Moreover, because the electrons are injected over the energy barrier, they enter the base region as non-equilibrium hot electrons, whereby the hot-electron energy is typically in the range of 0.5 and 1.0 eV depending upon the selection of the metal/semiconductor combination.

The energy and momentum distribution of the hot electrons change as the electrons move through the base region and are subjected to inelastic and elastic scattering. As such, electrons are prevented from entering the collector region if their energy is insufficient to overcome the energy barrier at the collector side. Moreover, the hot-electron momentum must match with the available states in the collector semiconductor to allow for the electrons to enter the collector region.

The collector current $I_C$, which indicates the fraction of electrons that is collected in the collector region is dependent upon the scattering in the base region, which is spin dependent when the base region contains magnetic materials. Furthermore, an external applied magnetic field controls the total scattering rate, which may, for example, change the relative magnetic alignment of the two ferromagnetic layers of the spin valve. The magnetocurrent (MC), which is the magnetic response of the SVT can be represented by the change in collector current normalized to the minimum value as provided by the following formula: $MC=[I^P{}_C-I^{AP}{}_C]/I^{AP}{}_C$, where P and AP indicate the parallel and anti-parallel state of the spin valve, respectively.

The drawbacks of some of the conventional devices are that the magnetic state of the device during non-operation, or during the non-active state, is not known. This causes the free layer to "wander", wherein the magnetization of the free layer is not oriented in a proper position resulting in an unstable device. Therefore, there is a need for a novel spin valve transistor which overcomes the limitations of the conventional devices.

SUMMARY OF THE INVENTION

The present invention has been devised to provide a structure and method compatible with sub-micron lithography to produce a spin valve transistor having an insulating hard bias stabilization. The present invention provides a spin valve transistor having a stable free layer in a highly sensitive read device. The present invention provides a spin valve transistor which has a read head in a shielded environment. The present invention provides a magnetic field sensor device having an insulating hard bias stabilization layer that is adjacent to the sensor having a track width and stripe height defined by separate lithography steps.

There is provided, according to one aspect of the invention, a spin valve transistor (SVT) comprising a magnetic field sensor, an insulating layer adjacent the magnetic field sensor, a bias layer adjacent the insulating layer, a non-magnetic layer adjacent the bias layer, and a ferromagnetic layer over the non-magnetic layer, wherein the insulating layer and the non-magnetic layer comprise insulating materials. The magnetic field sensor comprises a base region, a collector region adjacent the base region, an emitter region adjacent the base region, and a barrier region located between the base region and the emitter region. The bias layer is between the insulating layer and the non-magnetic layer. Additionally, a ferromagnetic layer is over the non-magnetic layer. The non-magnetic layer comprises an insulator, and the base layer comprises at least one ferromagnetic layer. The bias layer is magnetic and is at least two times the thickness of the magnetic materials contained in the base region. Moreover, the insulating layer may comprise antiferromagnetic materials, and the non-insulating layer may comprise antiferromagnetic materials.

Additionally, the present invention provides a magnetic head comprising a magnetic field sensor, an insulating layer adjacent said magnetic field sensor, a bias layer adjacent the insulating layer, and a non-magnetic layer adjacent the bias layer. Moreover, the present invention provides a disk drive including a magnetic head comprising a read head element, a write head element operable with the read head element, wherein the read head element comprises a magnetic field sensor, an insulating layer adjacent the magnetic field sensor, a bias layer adjacent the insulating layer, and a non-magnetic layer adjacent the bias layer.

The present invention further provides a method of manufacturing a spin valve transistor, wherein the method comprises placing an insulating layer adjacent a magnetic field sensor, positioning a magnetic hard bias layer adjacent the insulating layer, laying a non-magnetic layer adjacent the bias layer, placing a ferromagnetic layer over the non-magnetic layer, and continuing with wafer processing. The magnetic field sensor comprises a base region, a collector region adjacent the base region, an emitter region adjacent the base region, and a barrier region located between the base region and the emitter region. The hard bias layer is positioned between the insulating layer and the non-magnetic layer.

The advantages of the present invention are several. First, the present invention can stabilize a free layer in a highly sensitive read head device. Also, the present invention can create a read head in a shielded environment. Moreover, the present invention provides a spin valve transistor with insulating hard bias stabilization that is adjacent to a magnetic field sensor, wherein the sensor has its track width and stripe height defined by separate lithography steps. The present invention further has a magnetic shield that covers the sensor device in an asymmetric shape relative to the plane of the deposited end of the substrate.

BRIEF DESCRIPTION OF THE DRAWINGS

The invention will be better understood from the following detailed description of a preferred embodiment(s) of the invention with reference to the drawings, in which:

FIG. 1(*b*) is a schematic top view diagram of the conventional disk drive of FIG. 1(*a*) shown without a cover;

FIG. 1(*c*) is a schematic diagram of a conventional spin valve transistor device;

FIG. 12(*b*) is a top-down view of a spin valve transistor device according to the present invention;

FIG. 13(*b*) is a top-down view of a spin valve transistor device according to the present invention;

FIG. 14(*b*) is a top-down view of a spin valve transistor device according to the present invention;

FIG. 15(*b*) is a top-down view of a spin valve transistor device according to the present invention;

FIG. 16(*b*) is a top-down view of a spin valve transistor device according to the present invention;

FIG. 17(*b*) is a top-down view of a spin valve transistor device according to the present invention;

FIG. 18(*b*) is a top-down view of a spin valve transistor device according to the present invention;

FIG. 19(*b*) is a top-down view of a spin valve transistor device according to the present invention;

FIG. 20(*b*) is a top-down view of a spin valve transistor device according to the present invention.

DETAILED DESCRIPTION OF PREFERRED EMBODIMENTS OF THE INVENTION

Figure 1A:
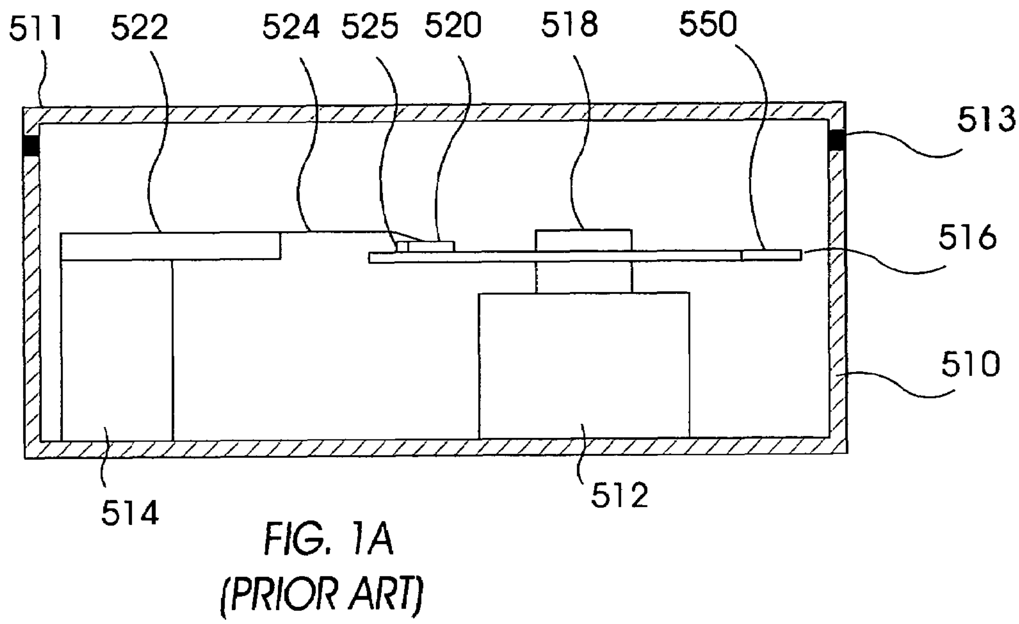
FIG. 1(*a*) is a schematic diagram of a conventional disk drive with a sensor.
Figure 1B:
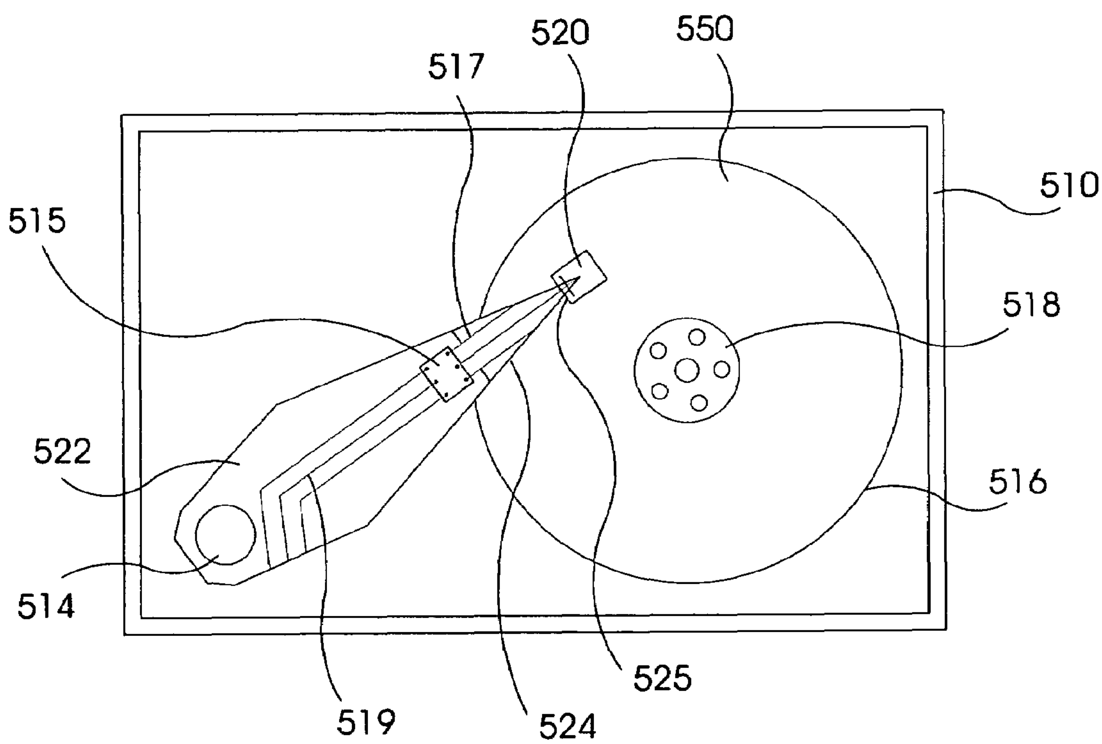
Figure 1C:
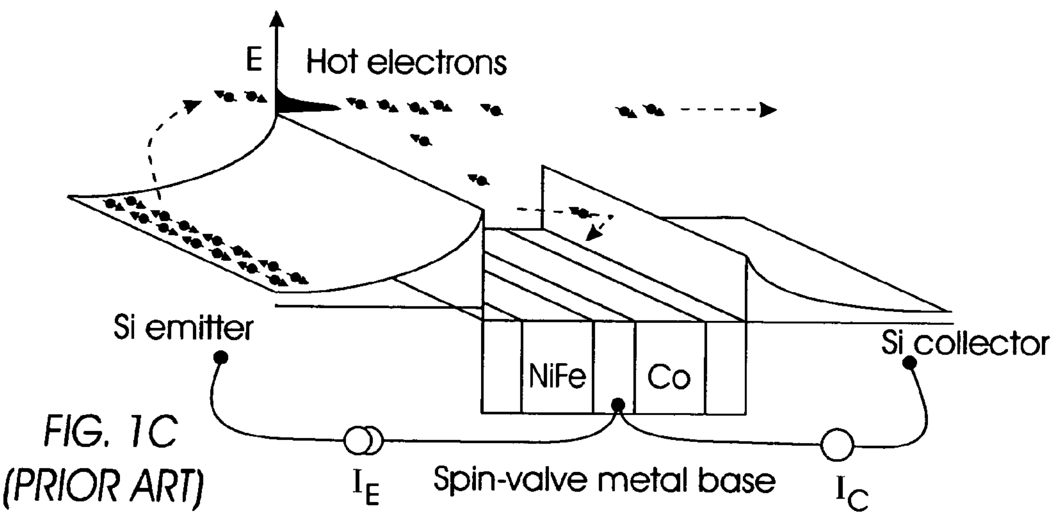

As previously mentioned, there is a need for a novel spin valve transistor device having insulating hard bias stabilization. Referring now to the drawings, and more particularly to FIGS. 2 through 20(*b*), there are shown preferred embodiments of the method and structures according to the present invention, in which there is provided a spin valve transistor 1 comprising a magnetic field sensor 3, an insulating layer 25 adjacent to the magnetic field sensor 3, and a hard bias layer 30 adjacent to the insulating layer 25.

Figure 2:
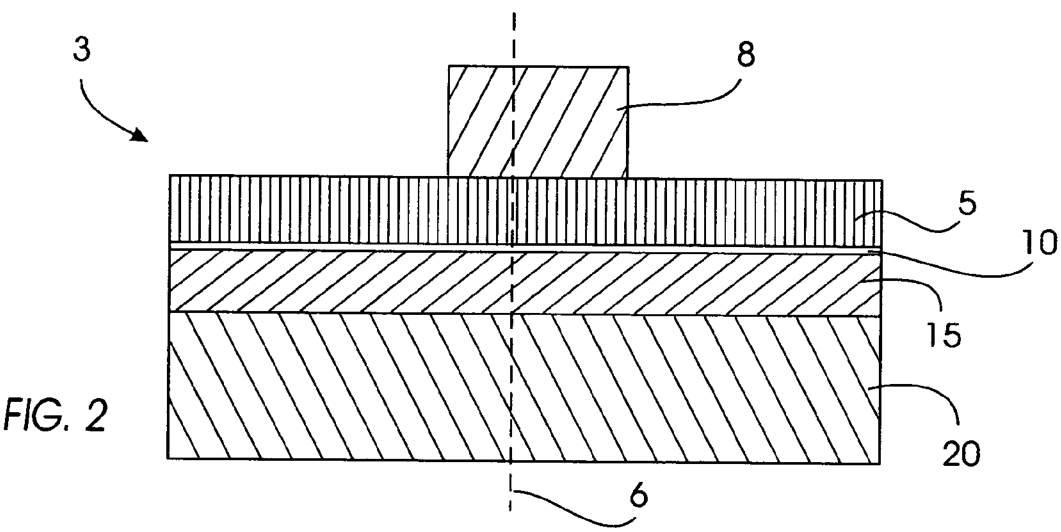
FIG. 2 is a cross-sectional diagram of a spin valve transistor device according to the present invention.

The processing steps involved in manufacturing the SVT 1 are sequentially illustrated in FIGS. 2 through 8, and in FIGS. 9 through 20(*b*), wherein there is shown in FIG. 2 a magnetic field sensor 3 comprising a base region 15, a collector region 20 adjacent the base region 15, an emitter region 5 adjacent the base region 15, and a barrier region 10 located between the base region 15 and the emitter region 5. A resist layer 8 is further shown adjacent the metal emitter 5, which defines the track width of the sensor 3. The sensor stack 3 intersects the ABS plane 6.

Figure 3:
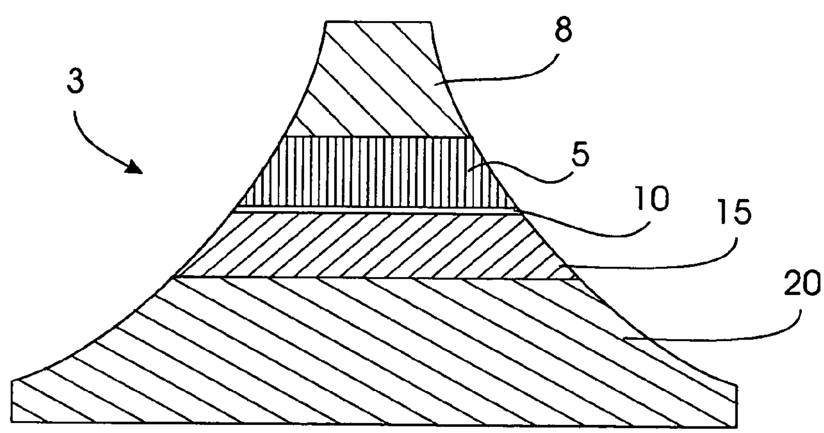
FIG. 3 is a cross-sectional diagram of a spin valve transistor device according to the present invention.
Figure 4:
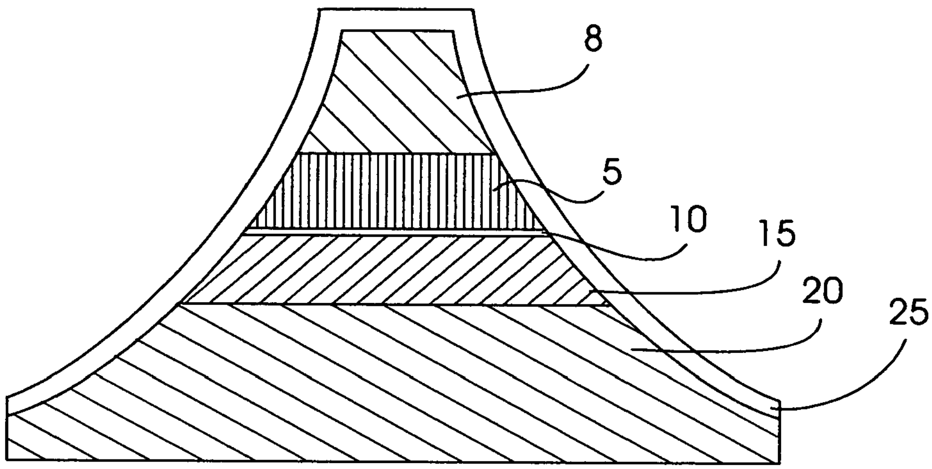
FIG. 4 is a cross-sectional diagram of a spin valve transistor device according to the present invention.

A cross-section of the device located along the ABS plane 6 is shown in FIG. 3. The device 3 is defined by milling at various mill angles for sensor sidewall definition. Then, as illustrated in FIG. 4, the insulating layer 25 is deposited around the remaining sensor 3. The insulating layer 25 comprises an insulator, such as NiO or alumina and is operable to electrically isolate the emitter 5 from the base 15.

The magnetic field sensor 3 allows hot electrons emitted from the emitter 5 to travel through to the base 15, and to reach the collector 20, which collects the magnetocurrent (collects the electrons). The base 15 preferably comprises at least one soft ferromagnetic material such as NiFe and CoFe. In operation, the device 3 acts as a hot spin electron filter, whereby the barrier 10 between the emitter 5 and the base 15 operates to selectively allow the hot electrons to pass on through to the base 15, and then on through to the collector 20. The barrier layer 10 is preferably comprised of aluminum oxide, and is generally less than ten angstroms in thickness.

Figure 5:
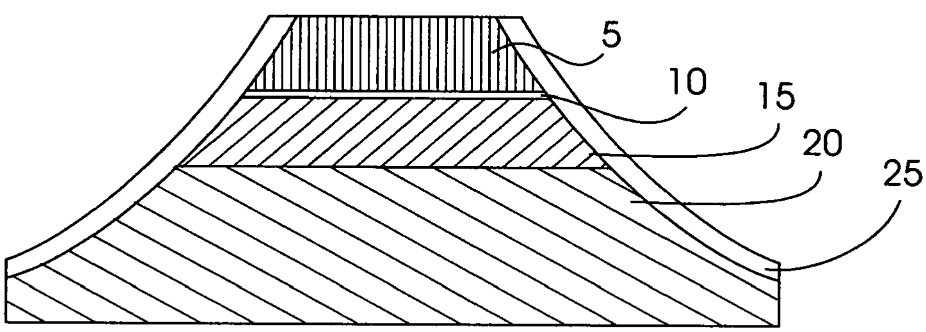
FIG. 5 is a cross-sectional diagram of a spin valve transistor device according to the present invention.

Next, as best seen in FIG. 5, the resist 8 is either removed via a liftoff process or chemical mechanical polish (CMP) assisted liftoff to break the sidewall redeposition of metal on the side of the resist to allow a solvent to remove any resist on the surface of the wafer. At the air bearing surface (ABS plane 6), the sensor 3 has insulation via the insulating layer 25 adjacent to the sensor 3.

Figure 6:
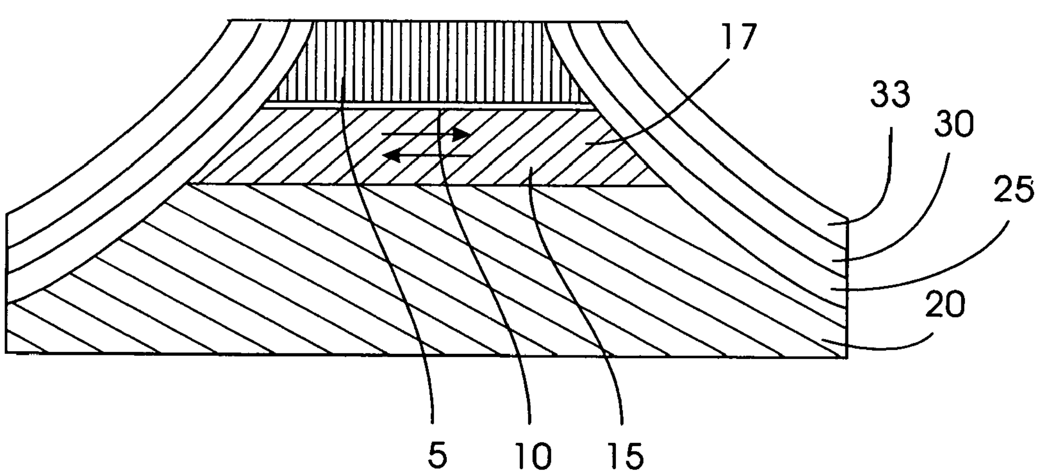
FIG. 6 is a cross-sectional diagram of a spin valve transistor device according to the present invention.

FIG. 6 shows the next step in the processing, whereby a hard bias magnetic layer 30 is deposited adjacent to the insulator layer 25. Then, a non-magnetic layer 33, preferably comprising alumina, is deposited adjacent the hard bias layer 30, wherein the hard bias layer 30 is sandwiched between the insulating layer 25 and the non-magnetic layer 33. The thickness of the hard bias layer 30 serves to stabilize the device 3, and moreover, allows the magnetization of the free layer 15 to point towards the hard bias layer 30, that is parallel to the ABS plane 6. Thus, when the spin valve transistor 1 is not functioning, the device 3 is in a known state (magnetization of the free layer 17, which comprises all or part of the base 15, is parallel to the ABS plane 6). This is advantageous over conventional devices because the free layer 15 is prevented from wandering, and in fact, is positioned (magnetization is pointed) in the correct position. The two possible directions of the free layer 17 magnetization, in the quiescent state, is shown with two arrows in FIG. 6. The direction of the magnetization depends on the direction of the magnetic field produced by the hard bias layer 30.

The scattering of electrons within the free layer 17 is dependent upon the orientation of the magnetization within the free layer 15. For example, if the magnetization is pointing upwards in the free layer 15 (parallel to the ABS plane), as provided by the present invention, then the electrons are not scattered as much, and the device 3 is in a known state. However, if the magnetization is pointing downwards, the electrons are scattered at a greater rate, but the device 3 remains in a known state. The performance of the device 3 may be different depending upon the relative configuration of the emitter 5, free layer 17, and the hard bias layer 30.

Figure 7:
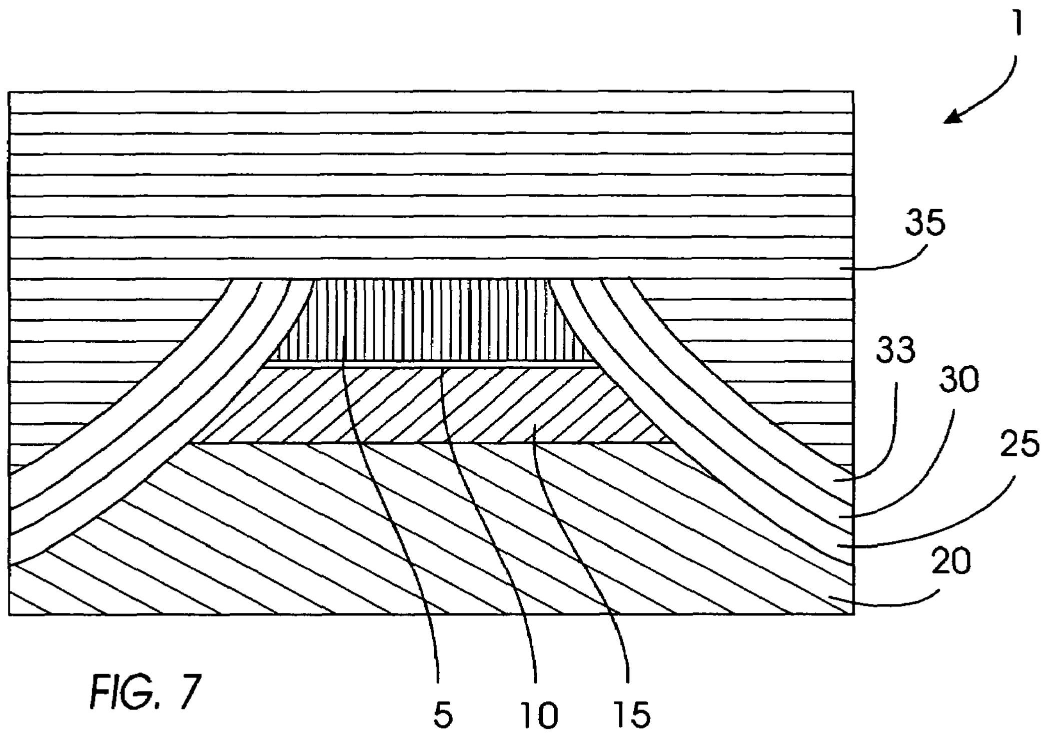
FIG. 7 is a cross-sectional diagram of a spin valve transistor device according to the present invention.

Next, in a preferred embodiment illustrated in FIG. 7, a top lead layer 35 is deposited over the non-magnetic layer 33 and acts as a shield 35 to the sensor 3. Preferably, this top lead 35 is ferromagnetic. The top lead 35 covers a majority of the sensor 3 including parts of the sides to minimize side reading. Moreover, the lead 35 also acts as the electrical connection for the emitter 5. The shield 35 does not channel magnetization, but still allows for an electrical connection to occur. Moreover, the shield 35 provides a connection to an external lead (not shown).

The thickness of the hard bias layer 30 is a factor with regard to free layer 17 pinning strength. Pinning strength relates to the relative freedom with which the magnetization direction free layer 17 is allowed to rotate. The hard bias layer 30 cannot be too thick because this would increase the space between the lead 35 and the free layer 17, which would essentially pin the free layer 17 in one magnetization direction preventing it from flipping freely. Likewise, a hard bias layer 30, which is too thin results in not enough pinning strength, causing an unstable sensor 3.

Similarly, an insulator 25 or non-magnetic layer 33, which is too thick also increases the spacing between the free layer 17 and the lead 35, thereby effecting the pinning strength. Thus, preferably the hard bias layer 30 is approximately at least three times the thickness of the free layer 17, wherein the free layer 17 is approximately 30–40 angstroms, the hard bias layer 30 is approximately 120–160 angstroms, and the insulator 25 is approximately 100–800 angstroms in thickness. Additionally, the hard bias layer 30 is at least two times the thickness of the magnetic materials included in the base region.

Figure 8:
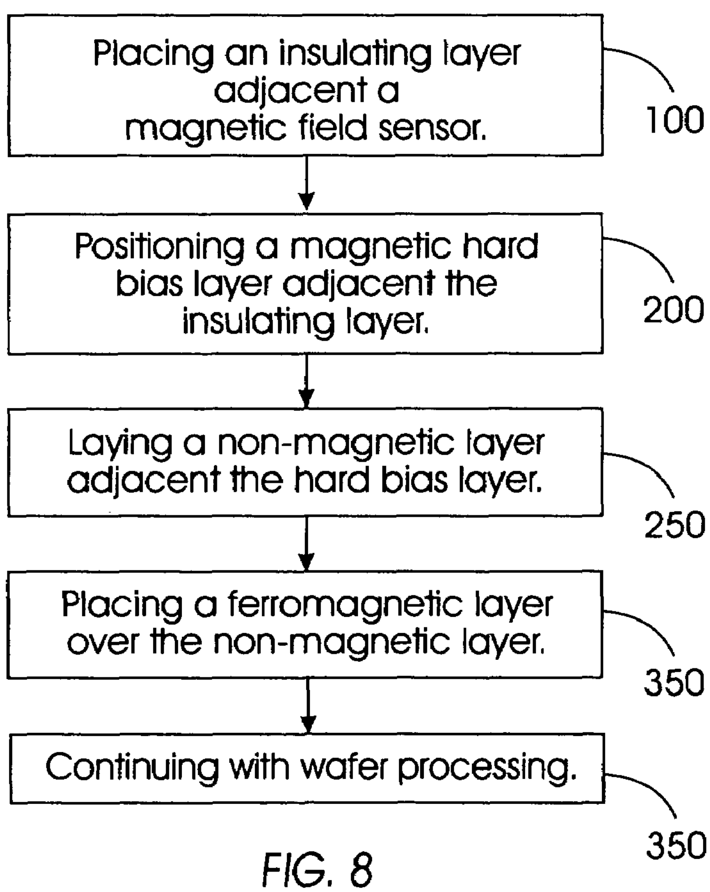
FIG. 8 is a flow diagram illustrating a preferred method of the invention.

A preferred method of manufacturing a spin valve transistor 1 is illustrated in the flow diagram of FIG. 8, wherein the method comprises placing 100 an insulating layer 25 adjacent a magnetic field sensor 3, and positioning 200 a magnetic hard bias layer 30 adjacent the insulating layer 25, wherein the magnetic field sensor 3 comprises an emitter region 5 adjacent a base region 15, a collector region 20 adjacent the base region 15, and a barrier region 10 located between the base region 15 and the emitter region 5. The method further comprises laying 250 a non-magnetic layer 33 adjacent the hard bias layer 30, and placing 350 a lead layer 35 over the non-magnetic layer 33. The process of the head build continues 360 after this point.

Figure 9:
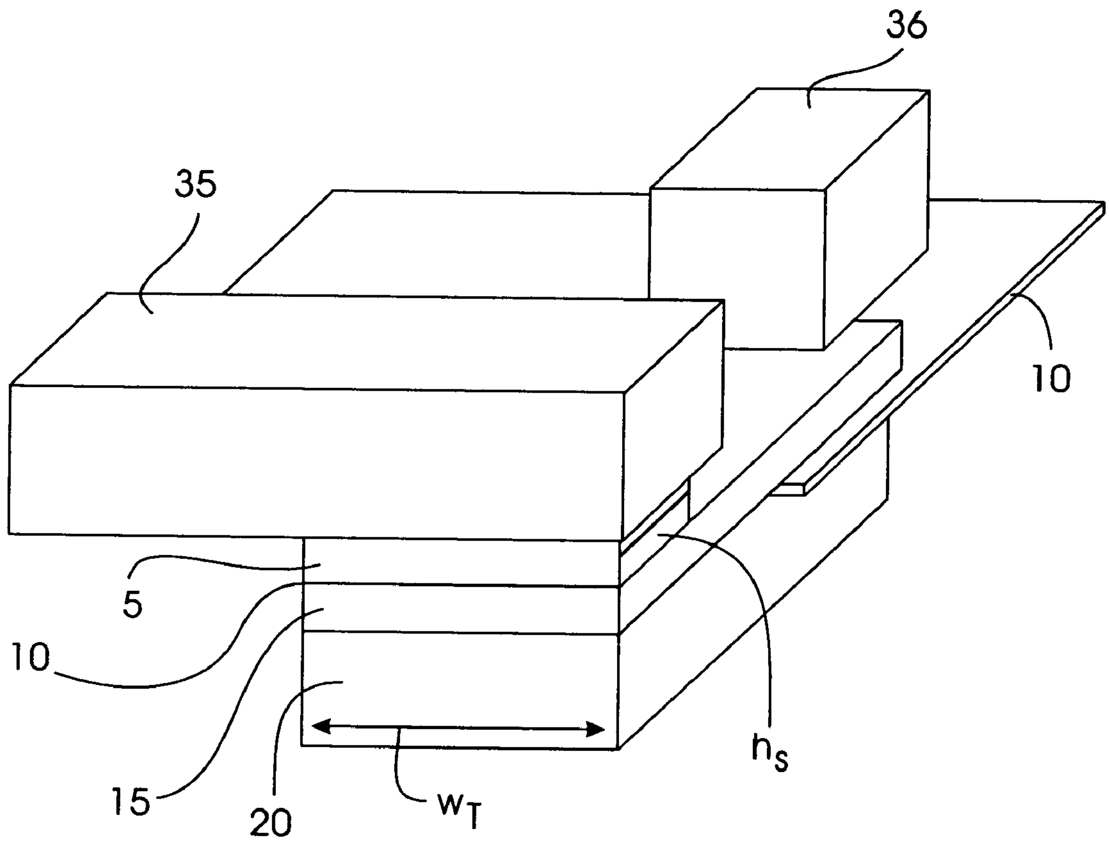
FIG. 9 is a perspective view of a spin valve transistor device according to the present invention.

A perspective view of a current tunnel transistor, embodied as a spin valve transistor, according to an embodiment of the invention is illustrated in FIG. 9. In this view, the current tunnel transistor is shown without a hard bias layer 30 nor an adjacent insulating layer 25. As indicated, the current tunnel transistor comprises a collector substrate 20, preferably comprising silicon. Above the barrier layer 10 is a base layer 15. A tunnel barrier layer 10 is configured over the base layer 15, wherein this tunnel barrier layer 10 creates a separation between the base layer 15 and the emitter 5. A lead connection 35, which may be embodied as a ferromagnetic shield, is positioned over the emitter region 5. A base lead 36 is positioned in contact with the base 15. The base lead 36 and the collector lead (not shown) are preferably not at the ABS. As indicated, the stripe height $h_S$ is defined by the dimensions of the emitter 5, while the track width $w_T$ is defined by the dimensions of the emitter 5, base 15, and collector 20.

Figure 10:
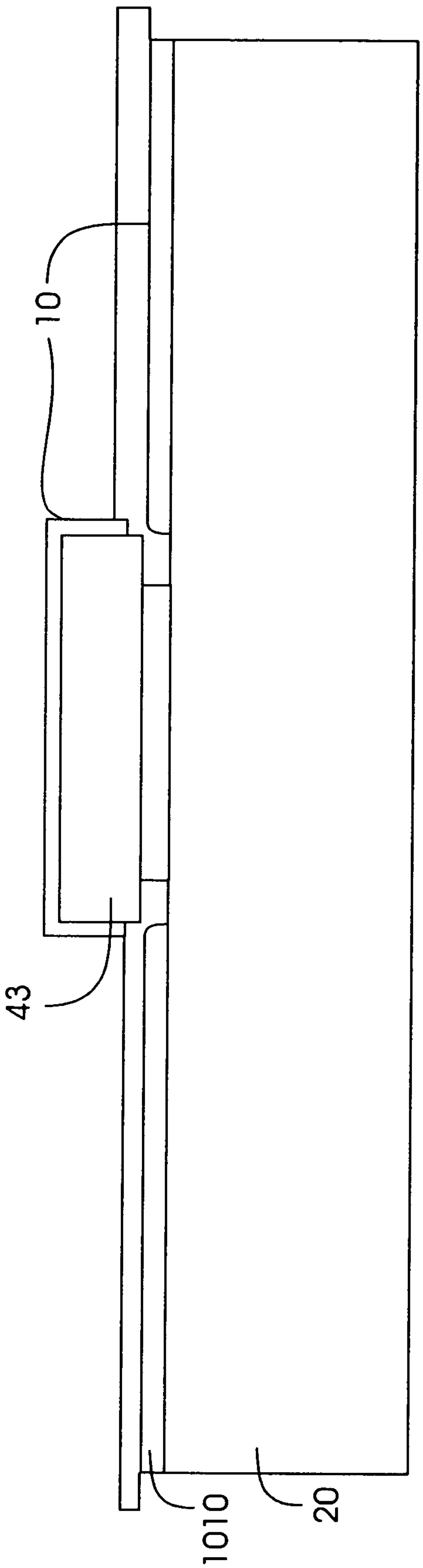
FIG. 10 is a cross-sectional diagram of a spin valve transistor device according to the present invention.
Figure 11:
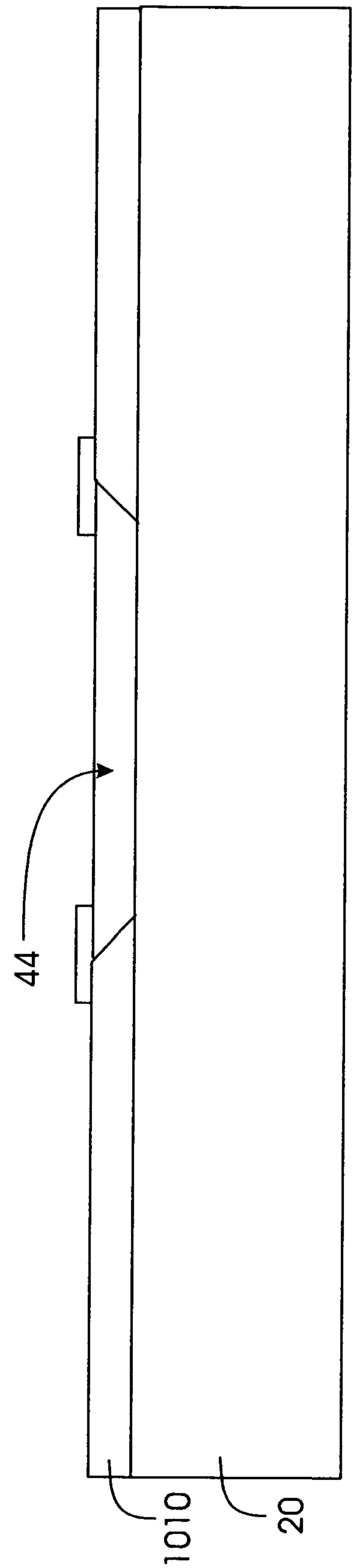
FIG. 11 is a cross-sectional diagram of a spin valve transistor device according to the present invention.
Figure 12B:
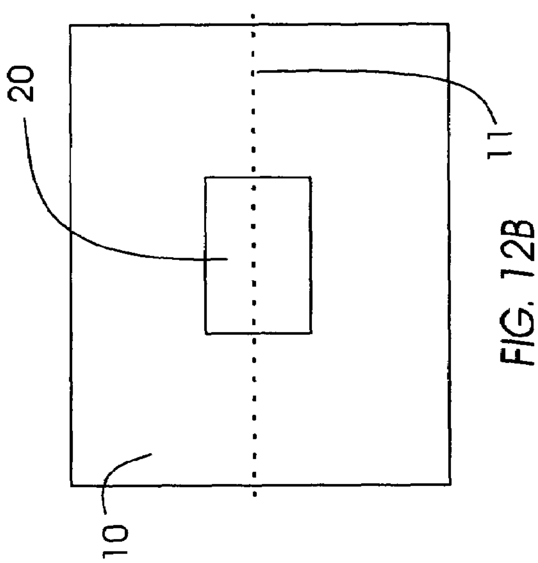
FIG. 12(*a*) is a cross-sectional diagram of a spin valve transistor device according to the present invention.

The spin valve transistor is manufactured using several lithographic steps. In FIG. 10, the collector substrate 20 is shown with an insulating oxide barrier 1010 disposed thereon. A resist pattern 43 is used to remove a portion of the tunnel barrier layer 10, which creates a via 44 down to the semiconductor substrate 20, which is shown in FIG. 11. The removal of the oxide barrier 1010 may be performed using conventional etching techniques. The air bearing surface 11 of the resulting sensor structure is represented by a dotted line in FIGS. 12(*a*) and 12(*b*) as well as in the subsequent drawings.

Figure 13B:
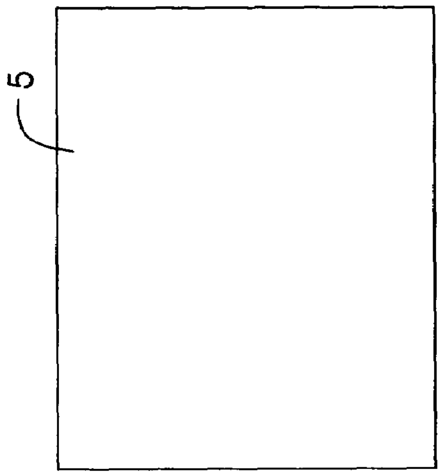
FIG. 13(*a*) is a cross-sectional diagram of a spin valve transistor device according to the present invention.
Figure 12A:
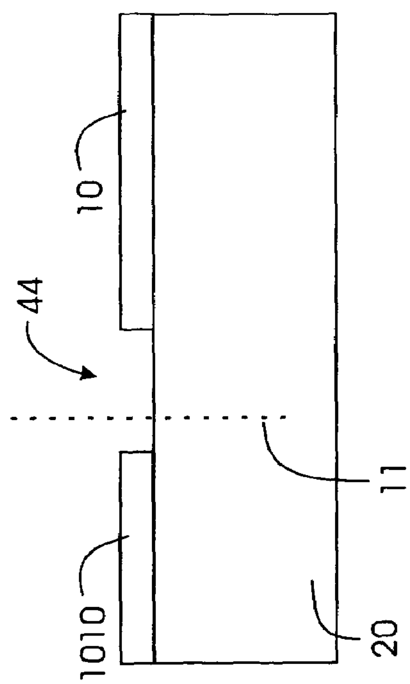
Figure 13A:
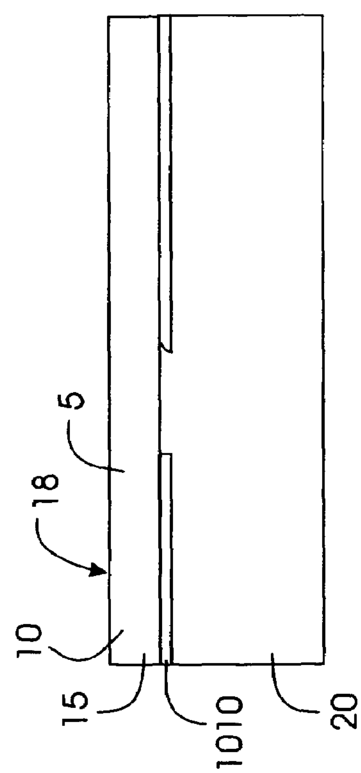

In FIG. 13(*a*) a sensor stack 18 is placed over the insulating barrier 1010 and into the via 44. The sensor stack 18 comprises the emitter region 5 positioned over barrier layer 10 and the base layer 15. The top-down view of FIG. 13(*b*) illustrates the upper cap of the sensor stack 18, which is actually the surface of the emitter 5.

Figure 14B:
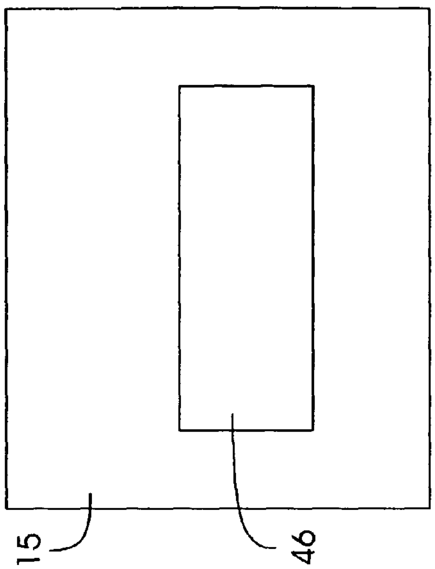
FIG. 14(*a*) is a cross-sectional diagram of a spin valve transistor device according to the present invention.
Figure 15B:
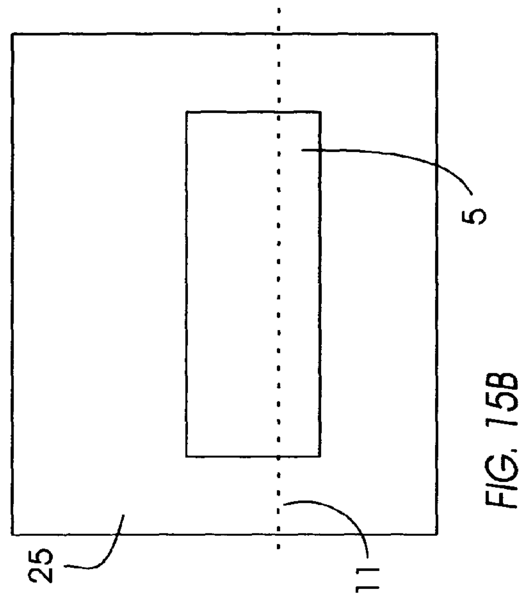
FIG. 15(*a*) is a cross-sectional diagram of a spin valve transistor device according to the present invention.
Figure 14A:
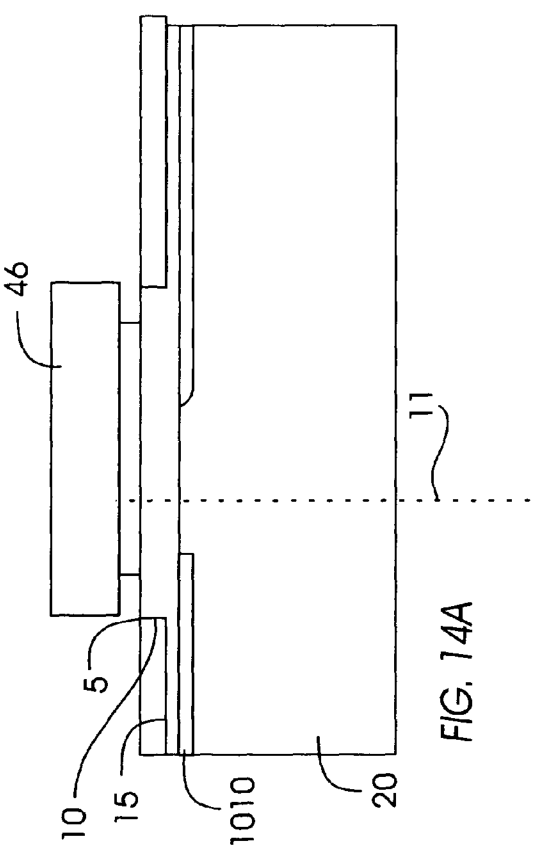
Figure 15A:
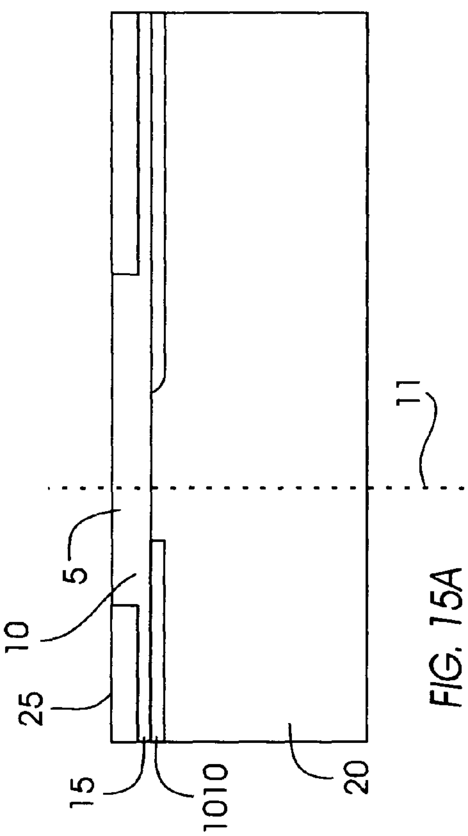

Next, as depicted in FIGS. 14(*a*) and 14(*b*), another resist 46 is used to pattern the sensor stack 18, where portions of the emitter region 5 are removed using known techniques such as ion milling or reactive ion etching. This exposes the base layer 15 and defines the stripe height $h_S$ of the device. Thereafter, as shown in FIGS. 15(*a*) and 15(*b*), an insulator 25, such as alumina, is filled in the areas over the exposed base layer 15.

Figure 16A:
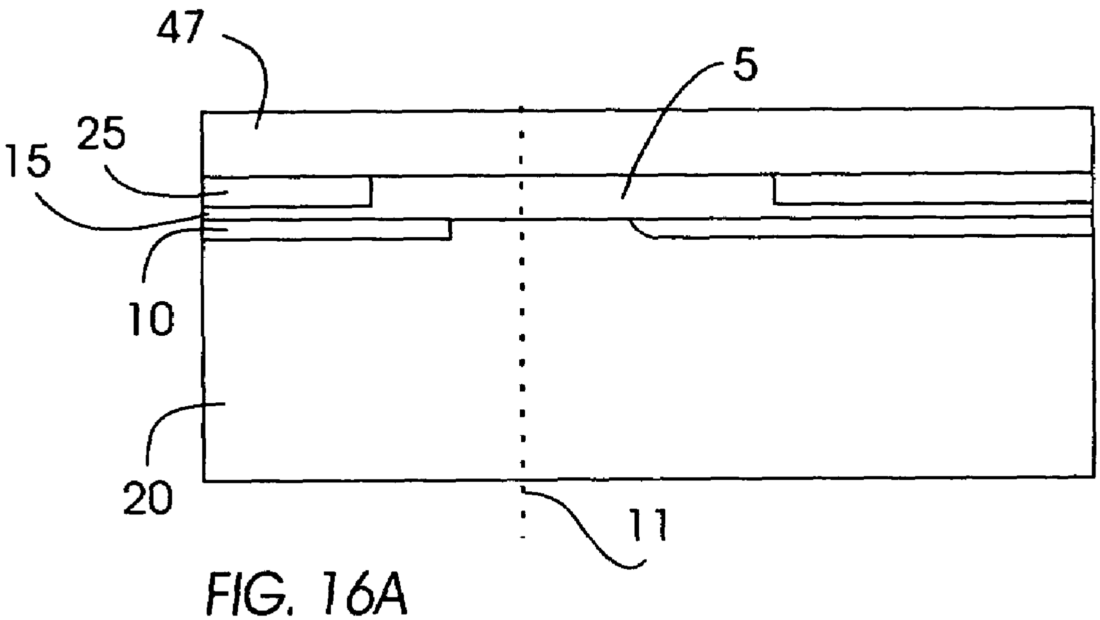
FIG. 16(*a*) is a cross-sectional diagram of a spin valve transistor device according to the present invention.
Figure 16B:
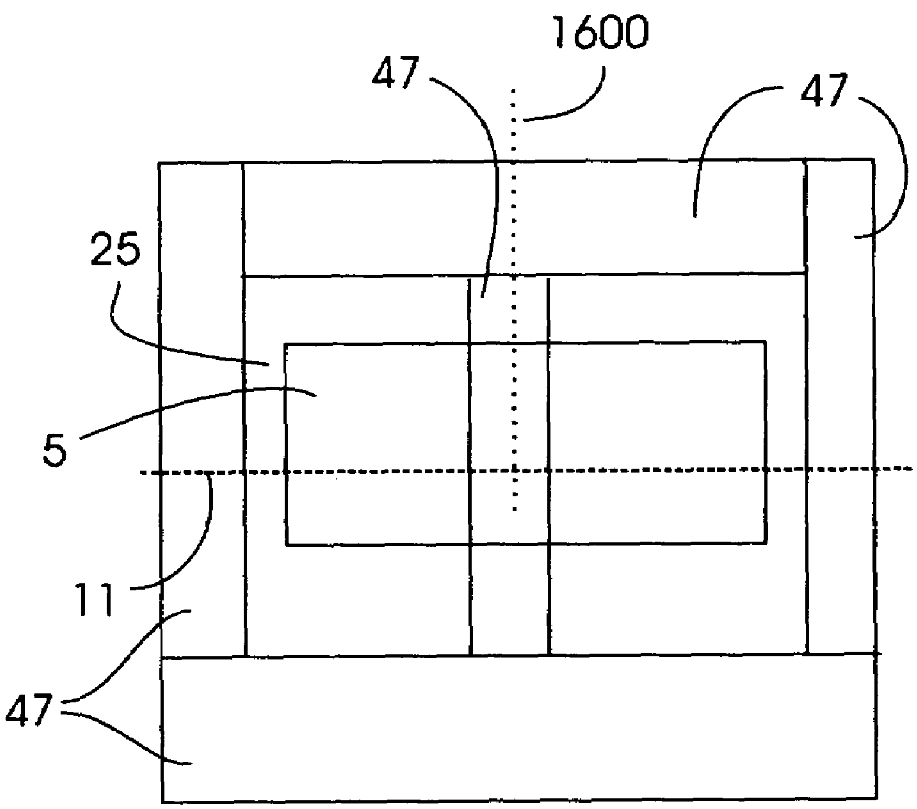

In the next stage of processing, illustrated in FIGS. 16(*a*) and 16(*b*), a resist 47 is used to pattern the transistor device along the track width axis 1600 of the device. The resist pattern 47 is best seen in the top-down view of FIG. 16(*b*) where the exposed portions of the insulator 25 and emitter 5 are shown. After the exposed material is removed, an insulating layer 25, a hard bias layer 30, and a non-magnetic layer 33 are deposited.

Figure 17A:
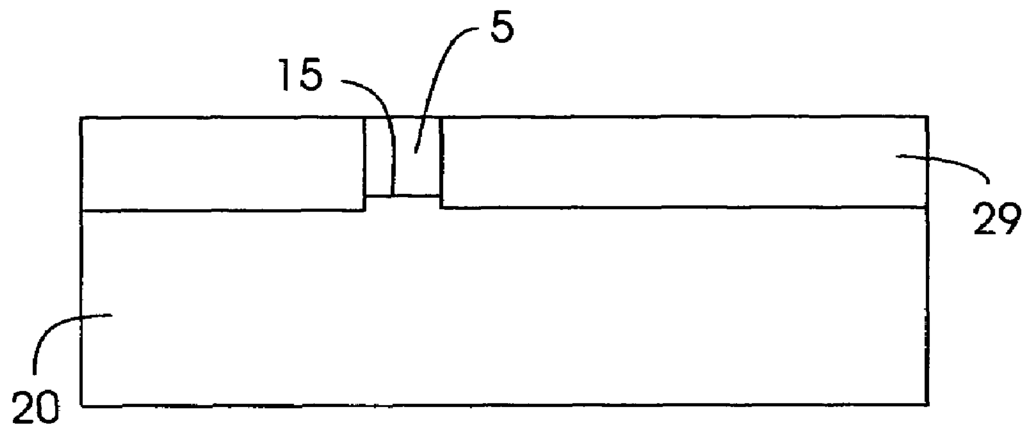
FIG. 17(*a*) is a cross-sectional diagram of a spin valve transistor device according to the present invention.
Figure 17B:
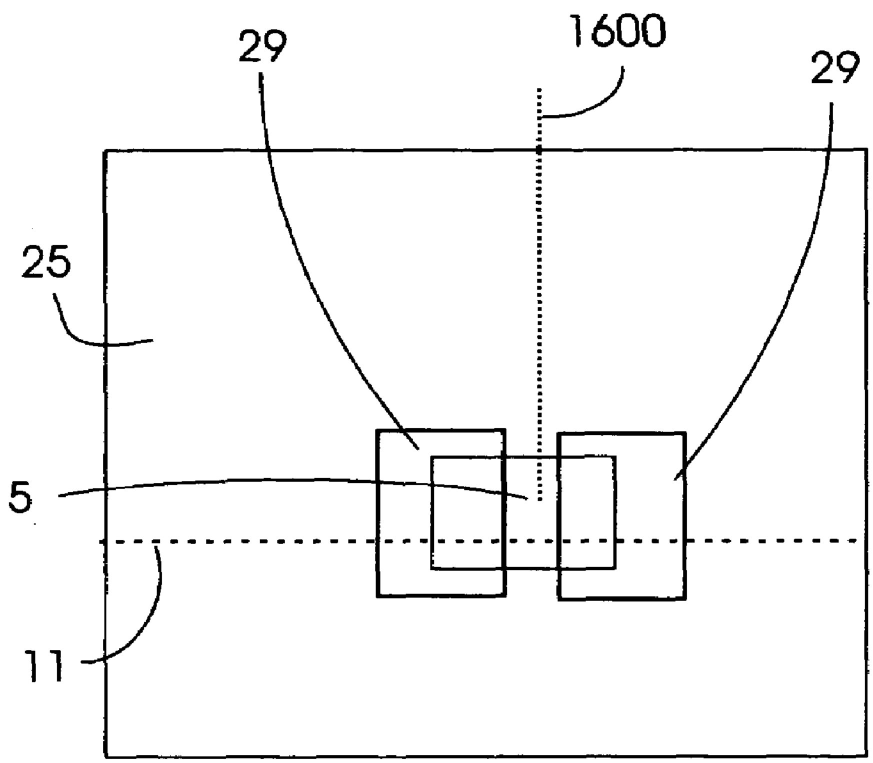

Collectively, the insulator 25, hard bias layer 30, and non-magnetic layer 33 form a stack 29, which is illustrated in FIG. 17(*a*), which shows the device in the ABS plane, and FIG. 17(*b*), which illustrates a top plan view of the device, where the ABS plane 11 is shown. Preferably, the non-magnetic layer 33 is also an insulator.

Figure 18A:
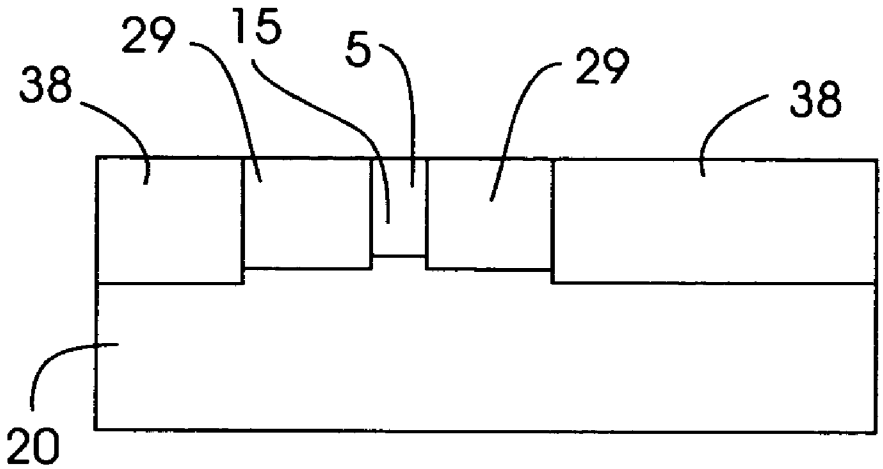
FIG. 18(*a*) is a cross-sectional diagram of a spin valve transistor device according to the present invention.
Figure 18B:
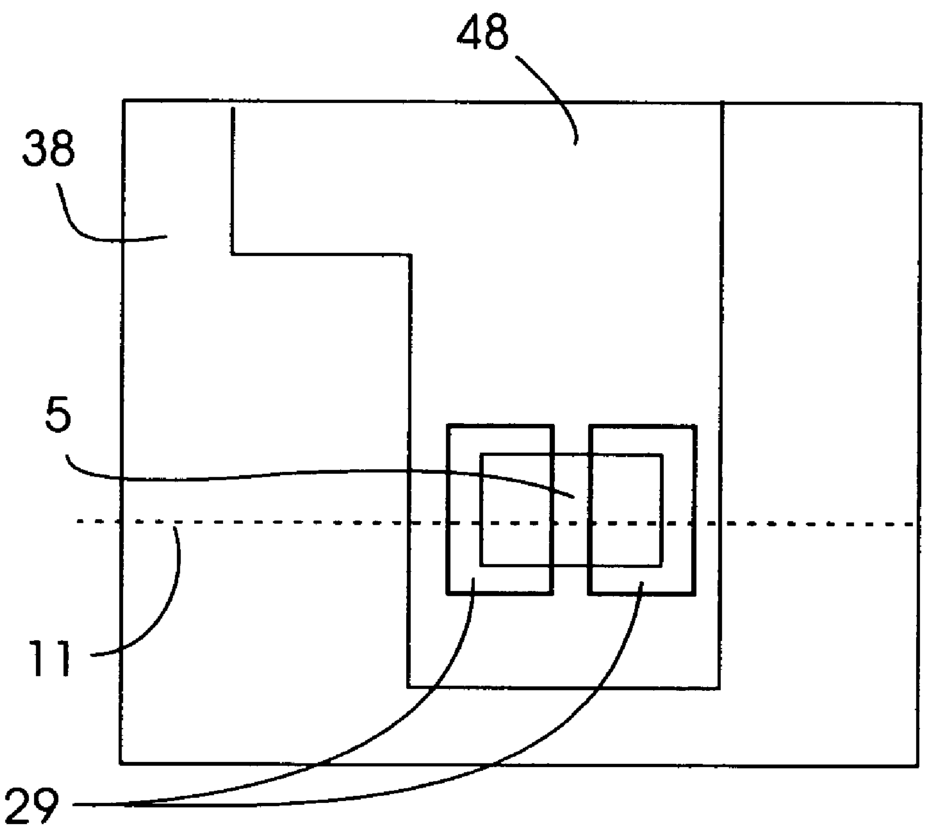
Figure 19B:
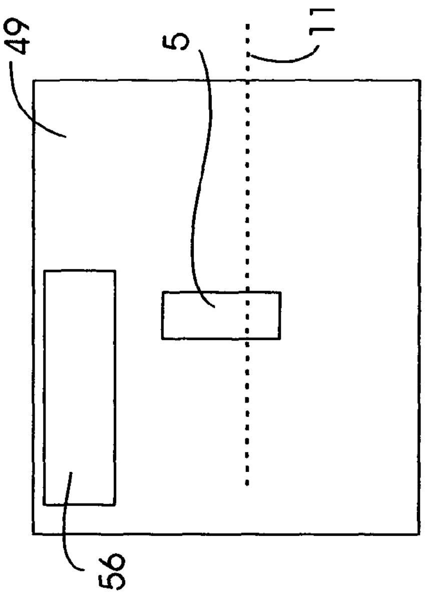
FIG. 19(*a*) is a cross-sectional diagram of a spin valve transistor device according to the present invention.
Figure 20B:
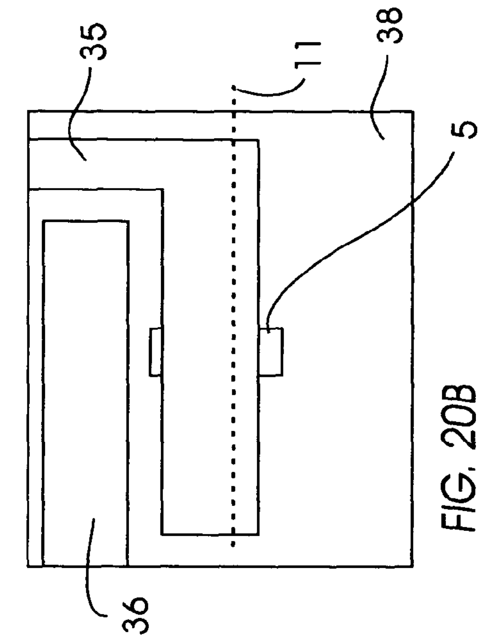
FIG. 20(*a*) is a cross-sectional diagram of a spin valve transistor device according to the present invention.
Figure 19A:
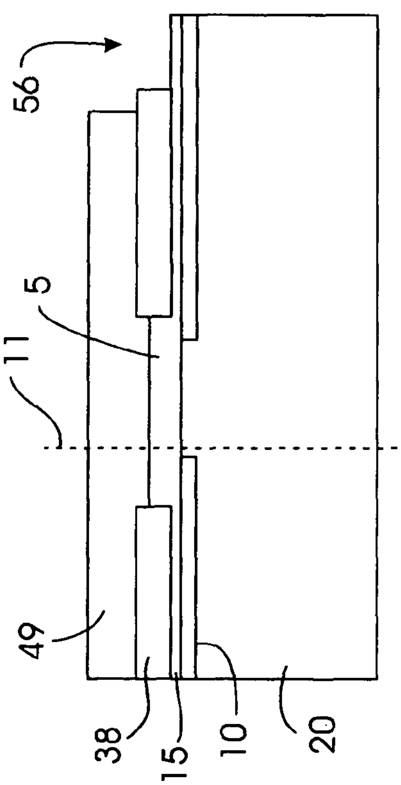
Figure 20A:
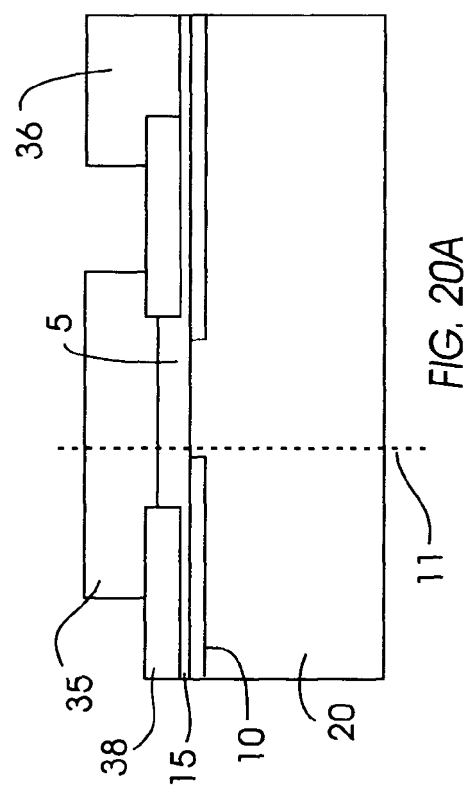

In FIGS. 18(*a*) (viewed in the ABS plane) and 18(*b*), portions of the stack 29 are removed along with portions of the refill alumina 25 and base 15, and the device is configured such that only the emitter 5 and a portion of the base 15 remaining is located between the insulator/bias/insulator stack 29. A resist 48 is used to pattern the device and an insulator 38 fills the exposed portions of the device. FIGS. 19(*a*) and 19(*b*) illustrate the device with a resist 49 used to pattern a via 56 to the base layer 15 and a via (not shown) to the collector 20. Thereafter, after patterning is completed, the transistor device is plated with a top lead 35 and base lead 36, wherein these leads 35, 36 preferably comprise NiFe. Other leads, such as the collector lead (not shown) can also be included in this lead plating step.

The advantages of the present invention are several. First, the present invention can stabilize a free layer 17 in a highly sensitive read head device 1. Also, the present invention can create a read head in a shielded environment. Moreover, the present invention provides a spin valve transistor 1 with insulating hard bias stabilization that is adjacent to a magnetic field sensor 3, wherein the sensor 3 has its track width and stripe height defined by separate lithography steps. The present invention also has at least three separate output connection pads 45 on top of the slider body 40. The present invention further has a magnetic shield 35 that covers the sensor device 3 in an asymmetric shape relative to the plane of the deposited end of the substrate, thereby stabilizing the device 3.

While the invention has been described in terms of preferred embodiments, those skilled in the art will recognize that the invention can be practiced with modification within the spirit and scope of the appended claims.

What is claimed is:

1. A half-shielded, magnetic bias stabilized spin valve transistor, comprising:

a semiconductor substrate, wherein said semiconductor substrate is operable as a collector of the transistor;

a base layer having two ends formed over said semiconductor substrate, wherein said base comprises a soft ferromagnetic material, wherein said soft magnetic material includes a magnetization which is responsive to an external magnetic field;

insulating material disposed adjacent to said ends of said base layer;

hard bias material disposed adjacent to said insulating material;

a barrier layer formed over said base layer;

an emitter layer formed over said barrier layer;

a top shield layer formed over said emitter layer, wherein said top shield layer comprises a ferromagnetic material.

* * * * *